United States Patent
Sun

(10) Patent No.: US 11,675,016 B2
(45) Date of Patent: Jun. 13, 2023

(54) DIAGNOSTIC DEVICE AND DIAGNOSTIC METHOD FOR BATTERY

(71) Applicant: TOYOTA JIDOSHA KABUSHIKI KAISHA, Toyota (JP)

(72) Inventor: Linyu Sun, Miyoshi (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 232 days.

(21) Appl. No.: 17/190,999

(22) Filed: Mar. 3, 2021

(65) Prior Publication Data

US 2021/0190872 A1 Jun. 24, 2021

Related U.S. Application Data

(63) Continuation of application No. 16/277,197, filed on Feb. 15, 2019, now Pat. No. 10,969,439.

(30) Foreign Application Priority Data

Mar. 2, 2018 (JP) .............................. JP2018-037676

(51) Int. Cl.
| | |
|---|---|
| *G01R 31/389* | (2019.01) |
| *G01R 31/3842* | (2019.01) |
| *G01R 31/367* | (2019.01) |
| *H01M 10/44* | (2006.01) |
| *G01R 31/36* | (2020.01) |

(52) U.S. Cl.
CPC ........... *G01R 31/389* (2019.01); *G01R 31/36* (2013.01); *G01R 31/367* (2019.01); *G01R 31/3842* (2019.01); *H01M 10/44* (2013.01); *H01M 2220/20* (2013.01)

(58) Field of Classification Search
CPC .............. G01R 31/389; G01R 31/3842; G01R 31/367; H01M 10/44; H01M 2220/20
See application file for complete search history.

(56) References Cited

U.S. PATENT DOCUMENTS

| | | | | |
|---|---|---|---|---|
| 6,486,637 | B1 * | 11/2002 | Nakanishi ............. | H02J 7/0014 320/150 |
| 6,611,128 | B2 * | 8/2003 | Minamiura ............... | B60L 3/12 320/134 |
| 9,696,382 | B2 * | 7/2017 | Cho ........................ | B60L 58/12 |

(Continued)

FOREIGN PATENT DOCUMENTS

| | | |
|---|---|---|
| JP | 2010-249770 A | 11/2010 |
| JP | 2015-126594 A | 7/2015 |

*Primary Examiner* — Jeff W Natalini
(74) *Attorney, Agent, or Firm* — Oliff PLC

(57) ABSTRACT

A diagnostic device for a battery includes a measurement unit configured to acquire a current value and a voltage value of the battery, and a diagnostic unit configured to calculate an internal resistance value of the battery based on the current value and the voltage value acquired by the measurement unit, and diagnose the battery based on the internal resistance value. The diagnostic unit is configured to cause the battery to perform discharge at a first current value and a second current value smaller than a predetermined target current value during a first period and a second period shorter than a predetermined target period, respectively, estimate the internal resistance value when the battery is caused to perform the discharge at the target current value during the target period, and diagnose the battery.

20 Claims, 7 Drawing Sheets

(56) References Cited

U.S. PATENT DOCUMENTS

| | | | |
|---|---|---|---|
| 10,594,145 B1 | 3/2020 | Wang et al. | |
| 10,969,439 B2 * | 4/2021 | Sun | G01R 31/367 |
| 2012/0004875 A1 | 1/2012 | Maeda et al. | |
| 2012/0262180 A1 | 10/2012 | Ishishita | |
| 2015/0088443 A1 | 3/2015 | Lorin et al. | |
| 2015/0185290 A1 | 7/2015 | Watanabe | |
| 2018/0031641 A1 | 2/2018 | Drees | |
| 2019/0168617 A1 * | 6/2019 | Ling | G01R 31/389 |
| 2019/0277919 A1 * | 9/2019 | Takahara | G01R 31/367 |
| 2020/0326378 A1 * | 10/2020 | Oono | H01M 10/06 |

* cited by examiner

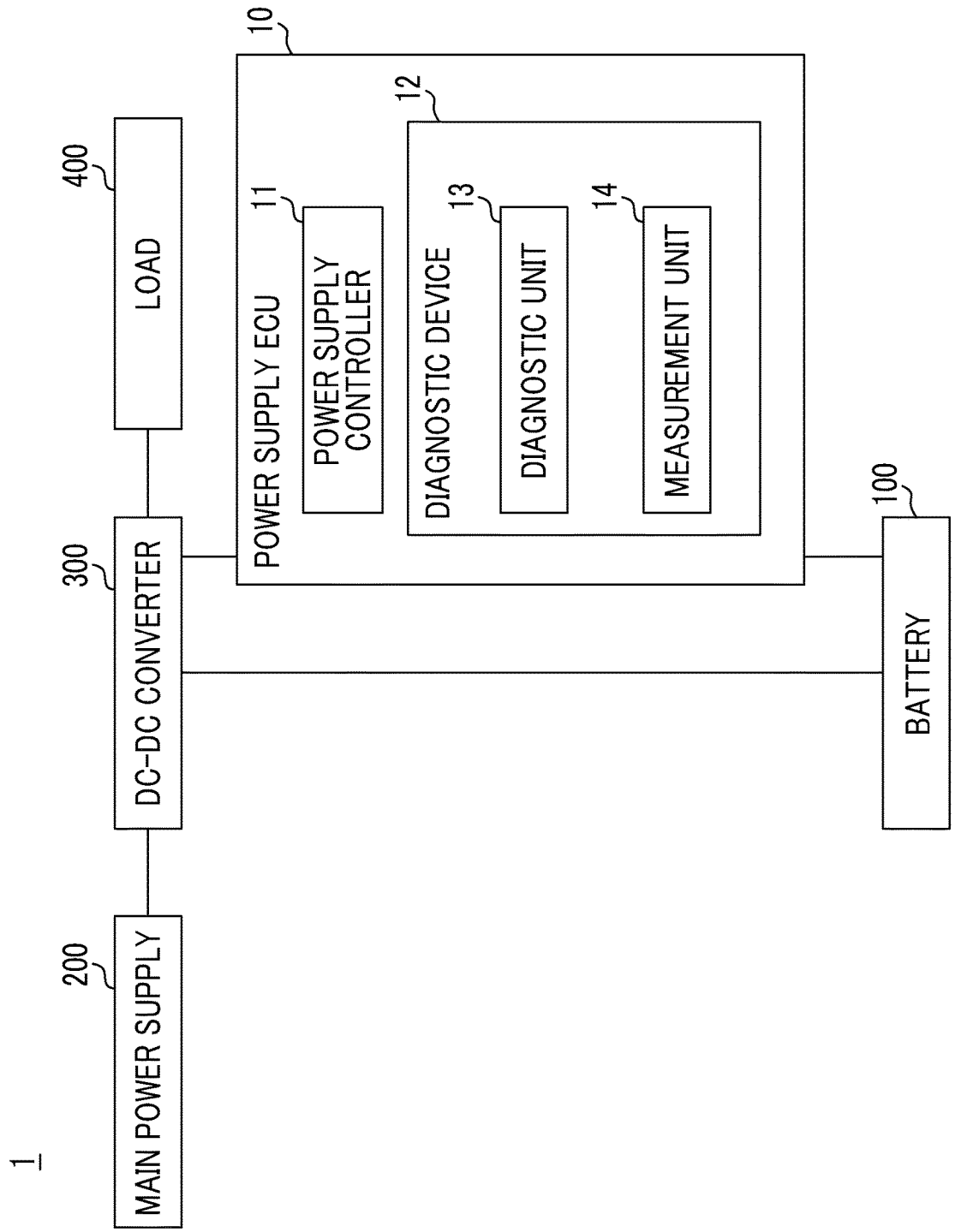

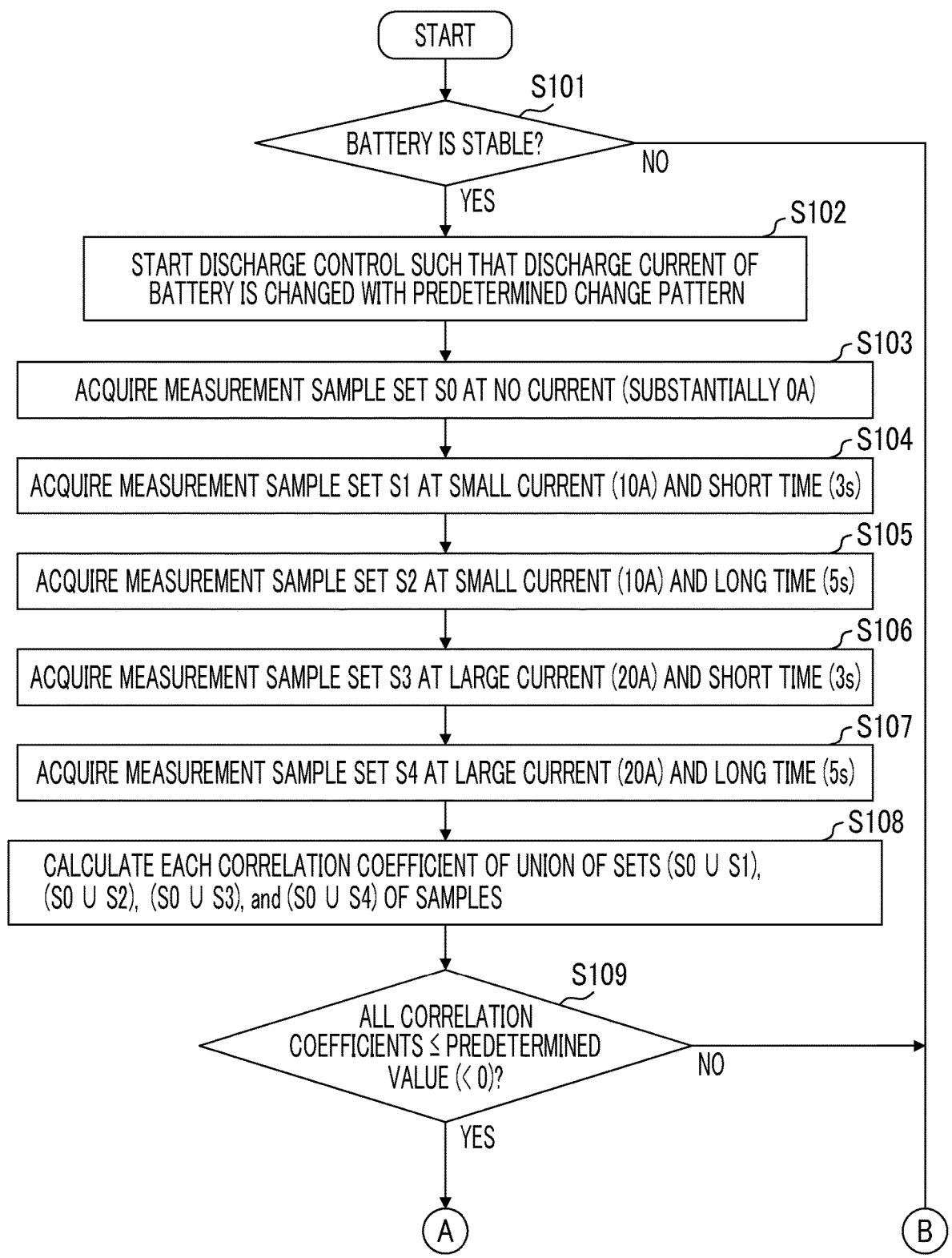

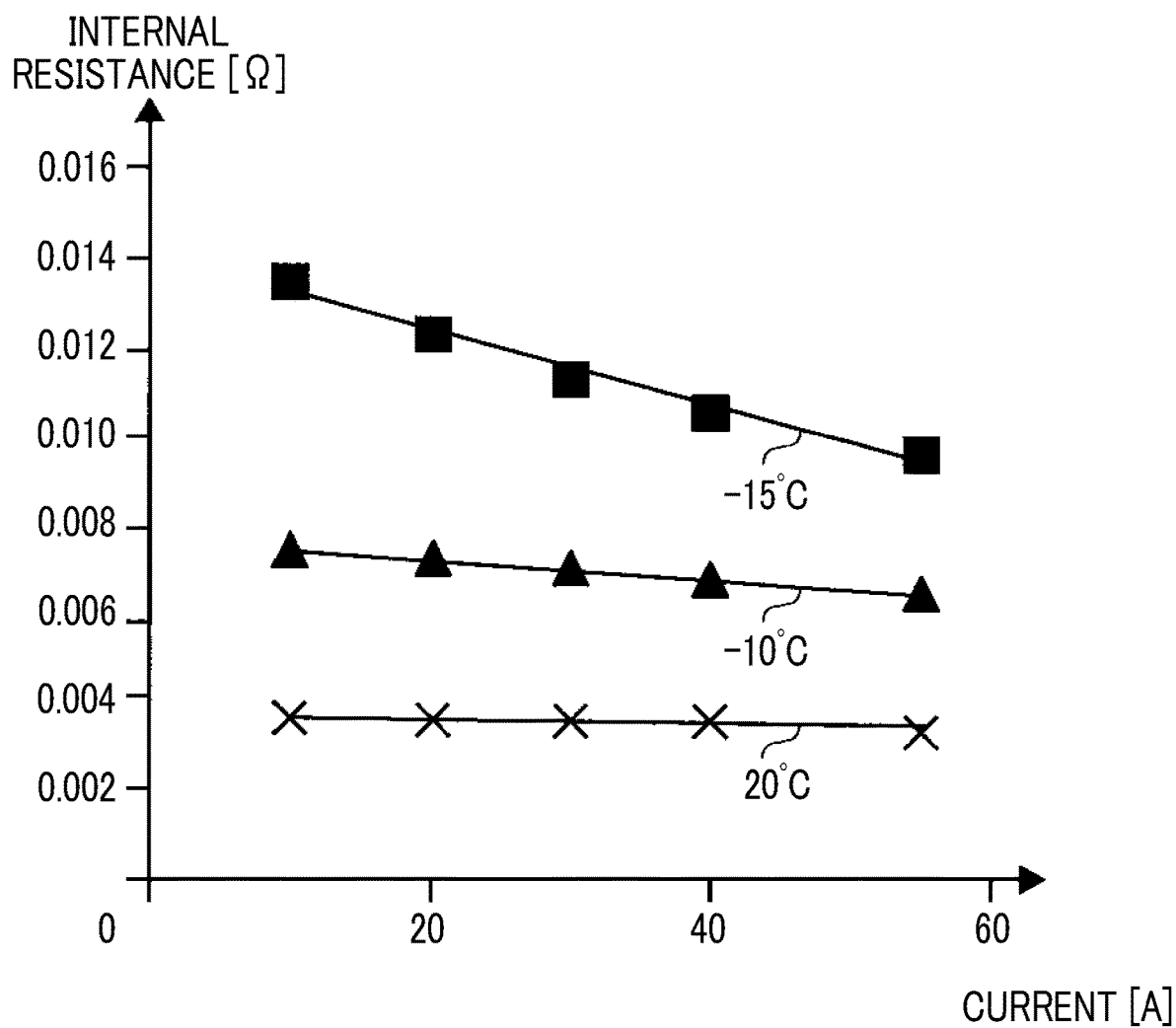

DIAGNOSTIC DEVICE AND DIAGNOSTIC METHOD FOR BATTERY

This application is a continuation application of U.S. patent application Ser. No. 16/277,197, filed Feb. 15, 2019, which claims priority to Japanese Patent Application No. 2018-037676 filed on Mar. 2, 2018. The entirety of each of the above disclosures are hereby incorporated by reference.

BACKGROUND

1. Technical Field

The disclosure relates to a diagnostic device and a diagnostic method for a battery mounted on a vehicle or the like.

2. Description of Related Art

In a vehicle or the like, a configuration in which a sub-battery is provided separately from a main power supply such as a main battery is adopted. The sub-battery supplies power to each functional unit of the vehicle to enable a predetermined retreating operation, for example, even when the main battery fails at the time of executing an autonomous driving function. Since the sub-battery is significant as described above, it is desirable to diagnose and check during normal traveling that the sub-battery has a predetermined power supply capacity.

For battery diagnosis, an internal resistance of the battery is generally used. Japanese Unexamined Patent Application Publication No. 2015-126594 (JP 2015-126594 A) discloses that determination accuracy is improved by calculating an internal resistance value and calculation accuracy thereof at a certain time interval based on a current value and a voltage value during traveling of a vehicle, and making determination on the degree of deterioration based on the internal resistance value when the calculation accuracy falls within a predetermined range. Japanese Unexamined Patent Application Publication No. 2010-249770 (JP 2010-249770 A) discloses that calculation accuracy is improved by acquiring a voltage and a current at the time of charging and a voltage and a current at the time of discharging after the same time from the point in time of switching between charging and discharging is elapsed, and calculating an internal resistance.

SUMMARY

In order to diagnose the sub-battery, it is desirable to use the internal resistance after discharging a target current during a predetermined target period. However, since the sub-battery may not have an opportunity to perform such discharge during normal traveling where the main battery does not fail, it is difficult to measure the internal resistance of the sub-battery. Further, when the discharge is performed for diagnosis, since power that the sub-battery can output may be insufficient in a case where the main battery fails immediately after the discharge, it is also difficult to measure the internal resistance of the sub-battery.

The disclosure provides a diagnostic device and a diagnostic method for a battery capable of diagnosing the battery while suppressing a discharge current and a discharge period of the battery.

A first aspect of the disclosure relates to a diagnostic device for a battery. The diagnostic device includes a measurement unit and a diagnostic unit. The measurement unit is configured to acquire a current value and a voltage value of the battery. The diagnostic unit is configured to calculate an internal resistance value of the battery based on the current value and the voltage value acquired by the measurement unit, and diagnose the battery based on the internal resistance value. The diagnostic unit is configured to cause the battery to perform discharge at a first current value smaller than a predetermined target current value during a first period shorter than a predetermined target period, and estimate a first internal resistance value that is the internal resistance value when the discharge at the first current value is continued during the target period, based on a change in the internal resistance value within the first period, cause the battery to perform discharge at a second current value smaller than the target current value and larger than the first current value during a second period shorter than the target period, and estimate a second internal resistance value that is the internal resistance value when the discharge at the second current value is continued during the target period, based on a change in the internal resistance value within the second period, estimate a third internal resistance value that is the internal resistance value when the battery is caused to perform the discharge at the target current value during the target period, based on the first internal resistance value and the second internal resistance value, and diagnose the battery based on the third internal resistance value.

According to the first aspect, it is possible to estimate the internal resistance value of the battery when discharge is performed at the target current value during the target period by discharging at the current value smaller than the target current value during the period shorter than the target period and to diagnose the battery.

In the diagnostic device according to the first aspect, the diagnostic unit may be configured to cause the battery to perform the discharge at the first current value and then perform the discharge at the second current value.

According to the aspect, since discharge at a large current value is performed after discharge at a small current value, the influence on the calculated internal resistance value can be reduced.

A second aspect of the disclosure relates to a diagnostic method for a battery executed by a computer of a diagnostic device for the battery. The diagnostic method includes causing the battery to perform discharge at a first current value smaller than a predetermined target current value during a first period shorter than a predetermined target period, and estimating a first internal resistance value that is an internal resistance value when the discharge at the first current value is continued during the target period, based on a change in the internal resistance value within the first period, which is calculated based on a current value and a voltage value of the battery, causing the battery to perform discharge at a second current value smaller than the target current value and larger than the first current value during a second period shorter than the target period, and estimating a second internal resistance value that is the internal resistance value when the discharge at the second current value is continued during the target period, based on a change in the internal resistance value within the second period, which is calculated based on the current value and the voltage value of the battery, estimating a third internal resistance value that is the internal resistance value when the battery is caused to perform the discharge at the target current value during the target period, based on the first internal resistance value and the second internal resistance value, and diagnosing the battery based on the third internal resistance value.

According to the second aspect, it is possible to estimate the internal resistance value of the battery when discharge is performed at the target current value during the target period by discharging at the current value smaller than the target current value during the period shorter than the target period and to diagnose the battery.

In the diagnostic method according to the second aspect, the battery may be caused to perform the discharge at the first current value and then perform the discharge at the second current value.

According to the aspects of the disclosure, it is possible to appropriately estimate the internal resistance value of the battery when discharge is performed at the target current value during the target period based on the change in the measurement value of the internal resistance when discharge is performed at two current values smaller than the target current value during periods shorter than the target period. Therefore, it is possible to provide the diagnostic device for the battery and the diagnostic method for the battery capable of diagnosing the battery while suppressing the discharge current and the discharge period of the battery.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein:

FIG. 1 is a functional block diagram showing a power supply system mounted on a vehicle according to an embodiment of the disclosure;

FIG. 2A is a flowchart showing diagnostic processing according to the embodiment of the disclosure;

FIG. 8 is a graph showing an example of a current characteristic of the internal resistance according to the embodiment of the disclosure.

DETAILED DESCRIPTION OF EMBODIMENTS

Overview

Figure 2B:
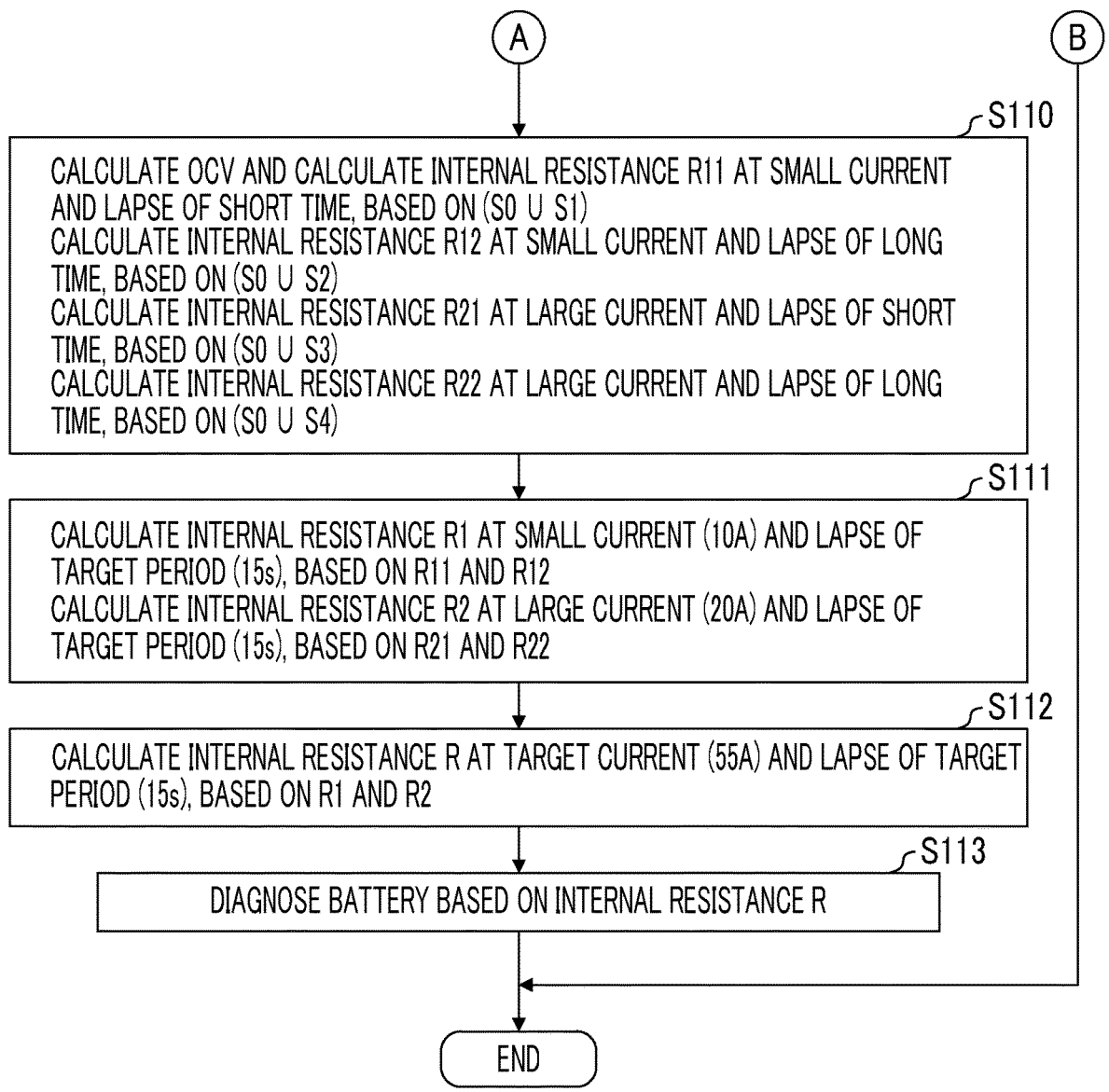
FIG. 2B is a flowchart showing diagnostic processing according to the embodiment of the disclosure.

A diagnostic device for a battery according to an aspect of the disclosure estimates an internal resistance value of the battery when discharge is performed at a target current value during a target period, from a measurement value of an internal resistance when discharge of the battery is performed at a current value smaller than the target current value during a period shorter than the target period, and diagnoses the battery based on the estimated value.

Embodiment

Hereinafter, an embodiment of the disclosure will be described in detail with reference to the drawings.

Configuration

FIG. 1 shows a functional block diagram of a power supply system 1 including a diagnostic device for a battery in the embodiment. The power supply system 1 is mounted on a vehicle, as an example. The power supply system 1 includes a battery (sub-battery) 100, a main power supply 200, a DC-DC converter 300, a load 400, and a power supply electronic control unit (ECU) 10. The main power supply 200 and the battery 100 are connected to the load 400 through the DC-DC converter 300. The power supply ECU 10 includes a power supply controller 11 that controls the DC-DC converter 300 to supply power from the main power supply 200 or the battery 100 to the load 400, and a diagnostic device 12 that diagnoses the battery 100. When the main power supply 200 is operating normally, the power supply controller 11 supplies power from the main power supply 200 to the load 400. However, when the power supply controller 11 detects that the main power supply 200 fails, the power supply controller 11 supplies power from the battery 100 to the load 400. The diagnostic device 12 includes a measurement unit 14 that measures a current and a voltage of the battery 100, and a diagnostic unit 13 that controls a discharge current of the battery 100 for using diagnosis, acquires a current value and a voltage value from the measurement unit 14 to calculate an internal resistance value of the battery 100, and diagnoses the battery 100 based on the calculated value. The diagnostic device 12 may be provided in the power supply ECU 10 to share some of the mounted parts with the power supply controller 11, or may be provided separately from the power supply ECU 10.

Processing

An example of diagnostic processing for a battery according to the embodiment will be described below. FIGS. 2A to 2B are flowcharts showing diagnostic processing executed by the diagnostic unit 13 of the diagnostic device 12. The processing is started and executed periodically, for example, during traveling of the vehicle. In the processing, it is assumed that a request of the battery 100 is met, that is, the battery 100 obtains a predetermined power value Wtarget at a voltage Vlow that is a lower limit voltage of voltages at which the load 400 can operate at the point in time when the current of the target current value (for example, 55 A) is output during the target period (for example, 15 s).

Step S101

The diagnostic unit 13 determines whether or not the battery 100 is stable. For example, the diagnostic unit 13 can acquire the current value of the battery 100 from the measurement unit 14, and when the current value is within a predetermined range during a certain period of time or longer, the diagnostic unit 13 can determine that the battery 100 is stable. When the diagnostic unit 13 determines that the battery 100 is stable, the processing proceeds to step S102, and when the diagnostic unit 13 determines that the battery 100 is not stable, the processing ends.

Step S102

Figure 3:
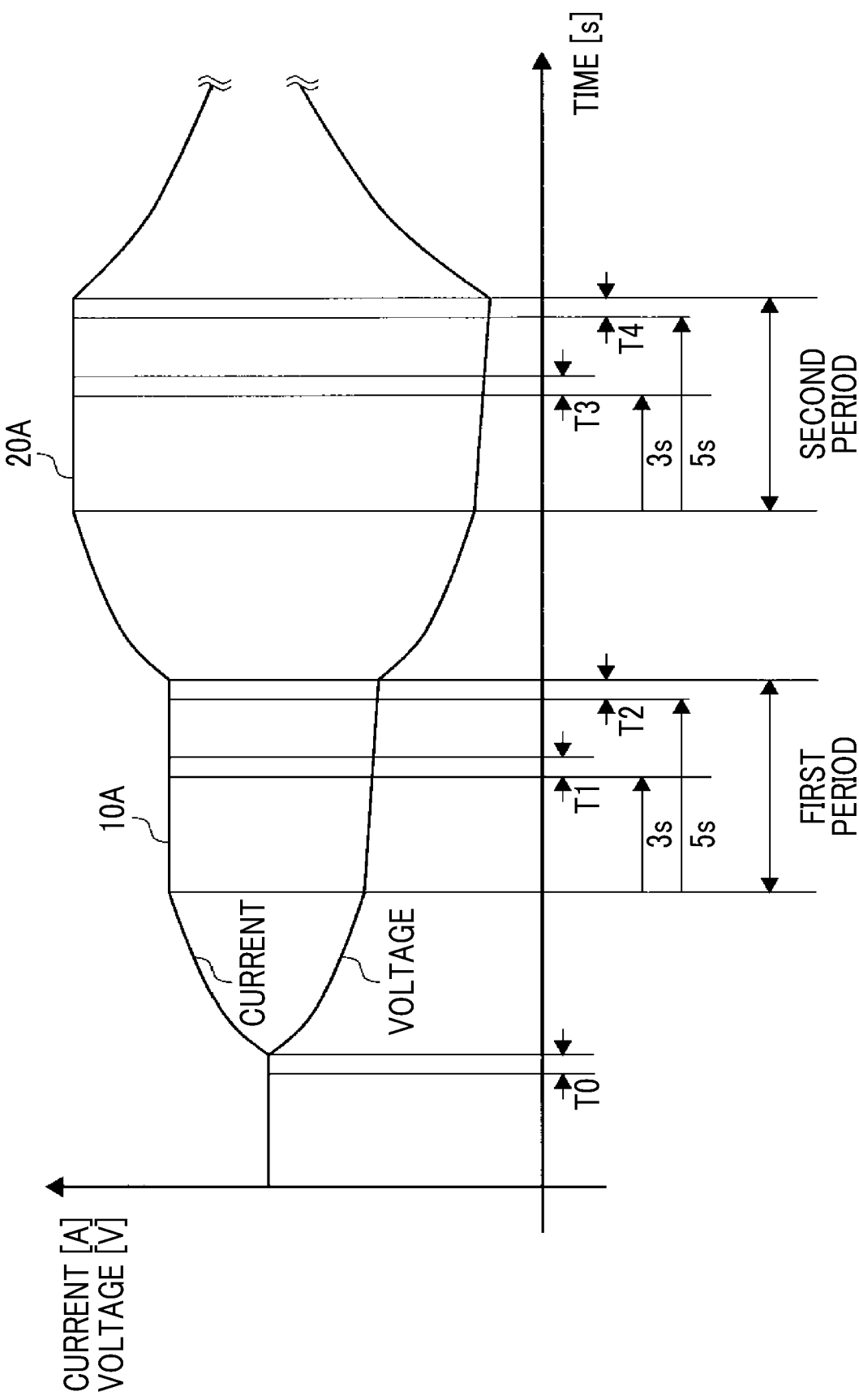
FIG. 3 is a graph showing an example of a current pattern used for diagnosis according to the embodiment of the disclosure.

The diagnostic unit 13 starts discharge control such that the discharge current of the battery 100 is changed with a predetermined change pattern. FIG. 3 shows an example of the change pattern of the discharge current of the battery 100. FIG. 3 also shows an example of a change pattern of the voltage of the battery 100 in accordance with a change in current. In an initial state, the current value is 0 A. In FIG. 3, the voltage level and the current level in the initial state are shown in a matched manner. In the change pattern, as an example, after the initial state of current 0 A, discharge is performed at a first current value (small current: 10 A) during a first period (5 s), and then discharge is performed at a second current value (large current: 20 A) larger than the first current value during a second period (5 s). Then, the discharge is stopped. The first current value and the second current value are smaller than the target current value, and the first period and the second period are shorter than the target period. Since the current value cannot be sharply changed, it is gradually changed. In the actual current value, fluctuation may occur even during the first period or the second period. The diagnostic unit 13 acquires the current value and the voltage value of the battery 100 measured by the measurement unit 14 while the discharge current of the battery 100 is changed with the change pattern, as in the following steps S103 to S106.

Step S103

The diagnostic unit 13 acquires a measurement sample that is a combination of the current value and the voltage value measured by the measurement unit 14 in a period T0 where the current value is 0 A (in the present specification, "0 A" includes "substantially 0 A" in its meaning). It is desirable to acquire a plurality of measurement samples, and the set of the measurement samples acquired in the step is denoted as S0. The period T0 is, for example, 0.5 s. The length of each subsequent period is also, for example, 0.5 s, and it is desirable to acquire a plurality of measurement samples within the period.

Step S104

The diagnostic unit 13 acquires a measurement sample set S1 that is a combination of the current value and the voltage value measured by the measurement unit 14, for example, in a period T1 of 0.5 s starting from the lapse of a short time (3 s) after the current value has reached 10 A (in the present specification, "10 A" includes "substantially 10 A" in its meaning).

Step S105

The diagnostic unit 13 acquires a measurement sample set S2 that is a combination of the current value and the voltage value measured by the measurement unit 14, for example, in a period T2 of 0.5 s starting from the lapse of a long time (5 s) after the current value has reached 10 A.

Step S106

The diagnostic unit 13 acquires a measurement sample set S3 that is a combination of the current value and the voltage value measured by the measurement unit 14, for example, in a period T3 of 0.5 s starting from the lapse of a short time (3 s) after the current value has reached 20 A (in the present specification, "20 A" includes "substantially 20 A" in its meaning).

Step S107

Figure 4:
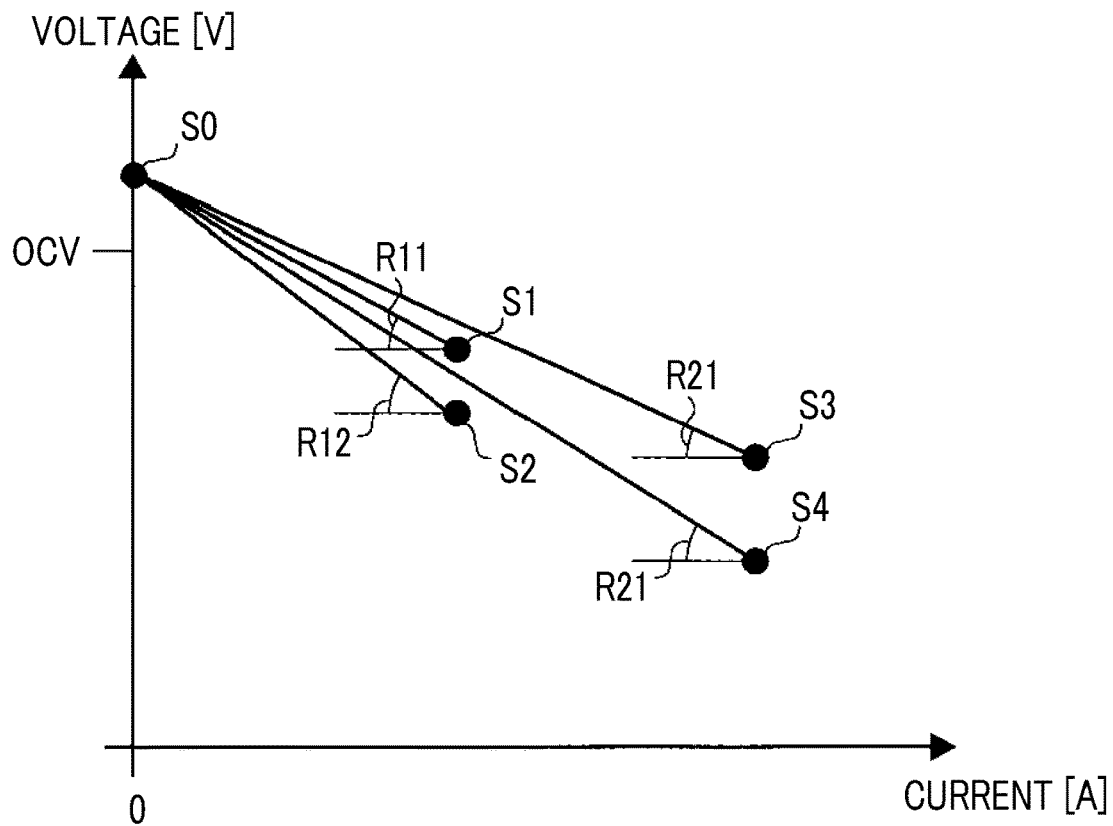
FIG. 4 is a graph showing examples of measurement samples and internal resistances at the time of diagnosis according to the embodiment of the disclosure.

The diagnostic unit 13 acquires a measurement sample set S4 that is a combination of the current value and the voltage value measured by the measurement unit 14, for example, in a period T4 of 0.5 s starting from the lapse of a long time (5 s) after the current value has reached 20 A. FIG. 4 shows a graph in which the horizontal axis represents a current, the vertical axis represents a voltage, and each of measurement sample sets S0 to S4 is mapped. In FIG. 4, each set is indicated by one dot. However, actually, a plurality of measurement samples which belongs to each set is distributed with a constant spread.

Step S108

The diagnostic unit 13 calculates a correlation coefficient of the measurement sample included in a union S0∪S1 of the measurement samples, which are two variables of a current and a voltage. Similarly, a correlation coefficient is also calculated for each of S0∪S2, S0∪S3, and S0∪S4. The correlation coefficient can take a value in the range from −1 to 1, but in any of the four union of sets, since the influence of the voltage drop due to the internal resistance of the battery 100 is accurately reflected on the measurement sample, the less the influence of other factors is, the more the correlation coefficient value has a negative correlation coefficient closer to −1.

Step S109

When all the correlation coefficients calculated in step S108 are equal to or less than a predetermined negative value (for example, −0.85) and the influence of the internal resistance is reflected with accuracy equal to or higher than a certain value, the processing proceeds to step S110 by the diagnostic unit 13, and otherwise, the diagnostic unit 13 ends the processing.

Step S110

As shown in FIG. 4, the diagnostic unit 13 linearly approximates the measurement sample included in the measurement sample sets S0, S1, calculates the intercept as a voltage OCV at no current, and calculates the magnitude of the slope as an internal resistance R11 at a first current value (small current 10 A) and the lapse of a short time (3 s). The diagnostic unit 13 linearly approximates the measurement sample included in the measurement sample sets S0, S2, and calculates the magnitude of the slope as an internal resistance R12 at the first current value (small current 10 A) and the lapse of a long time (5 s). The diagnostic unit 13 linearly approximates the measurement sample included in the measurement sample sets S0, S3, and calculates the magnitude of the slope as an internal resistance R21 at a second current value (large current 20 A) and the lapse of a short time (3 s). The diagnostic unit 13 linearly approximates the measurement sample included in the measurement sample sets S0, S4, and calculates the magnitude of the slope as an internal resistance R22 at the second current value (large current 20 A) and the lapse of a long time (5 s).

Step S111

Figure 5:
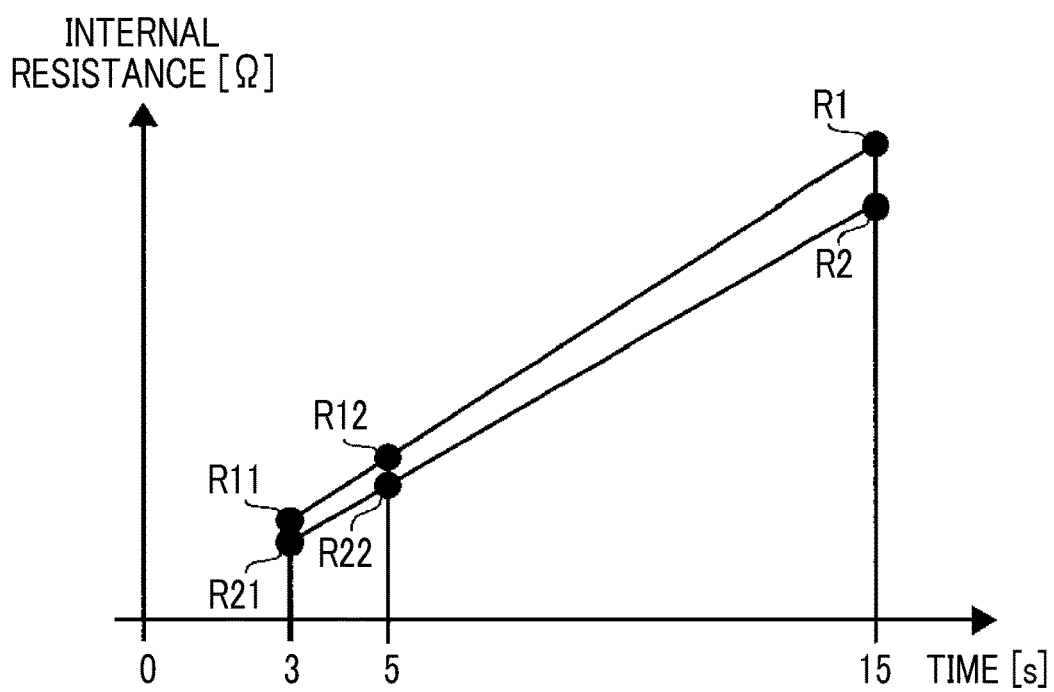
FIG. 5 is a graph showing an example of extrapolation processing of internal resistances according to the embodiment of the disclosure.

The diagnostic unit 13 linearly extrapolates the calculated internal resistances R11, R12 along the time and sets a value corresponding to the target period (15 s) as an internal resistance R1 (first internal resistance value) at the first current value (small current 10 A) and the lapse of the target period (15 s). The diagnostic unit 13 linearly extrapolates the calculated internal resistances R21, R22 along the time and sets a value corresponding to the target period (15 s) as an internal resistance R2 (second internal resistance value) at the second current value (large current 20 A) and the lapse of the target period (15 s). FIG. 5 shows a graph in which the horizontal axis represents a time, the vertical axis represents an internal resistance, and the internal resistances R11, R12, R21, R22, R1, R2 are mapped.

Figure 6:
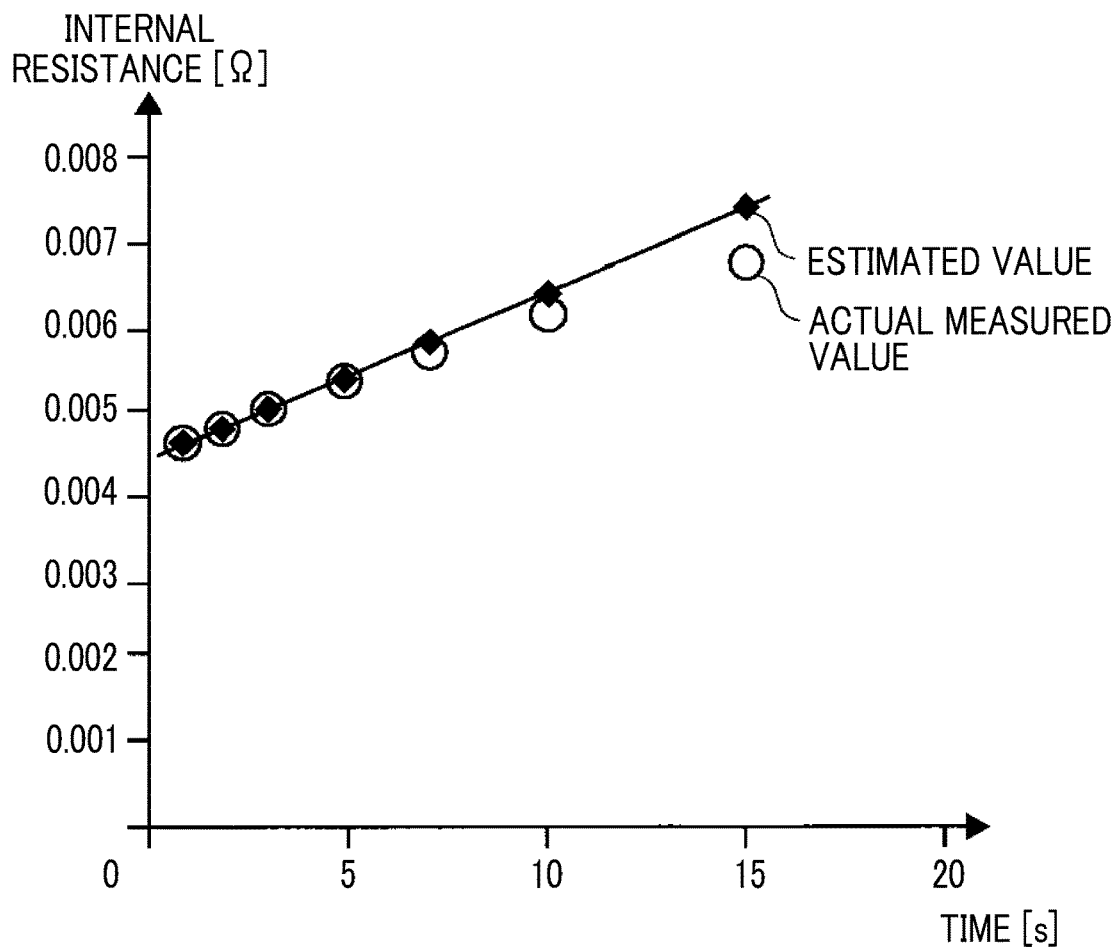
FIG. 6 is a graph showing an example of a time characteristic of the internal resistance according to the embodiment of the disclosure.

Here, the general characteristics of the internal resistance of the battery will be described. FIG. 6 is a graph in which the horizontal axis represents a discharge time, the vertical axis represents an internal resistance, and an internal resistance value estimated by a predetermined linear approximation model and the actually measured internal resistance value when the battery 100 is discharged at 0° C. and 40 A are shown. As shown in FIG. 6, in general, when the discharge current is constant, the internal resistance of the battery can obtain a roughly good approximation by a linear approximation model with respect to time. However, as the discharge time becomes longer, the progressing speed of polarization of the battery slows down, so it tends to be slightly smaller than the estimated value of the linear approximation model in practice.

Therefore, determination can be made that the internal resistances R1, R2 calculated by linear extrapolation along the time in the step are slightly larger than actual values, but they are roughly good estimated values, as the estimated values of the internal resistance when the discharge is performed at the constant currents of 10 A and 20 A during the target period of 15 s, respectively.

Step S112

Figure 7:
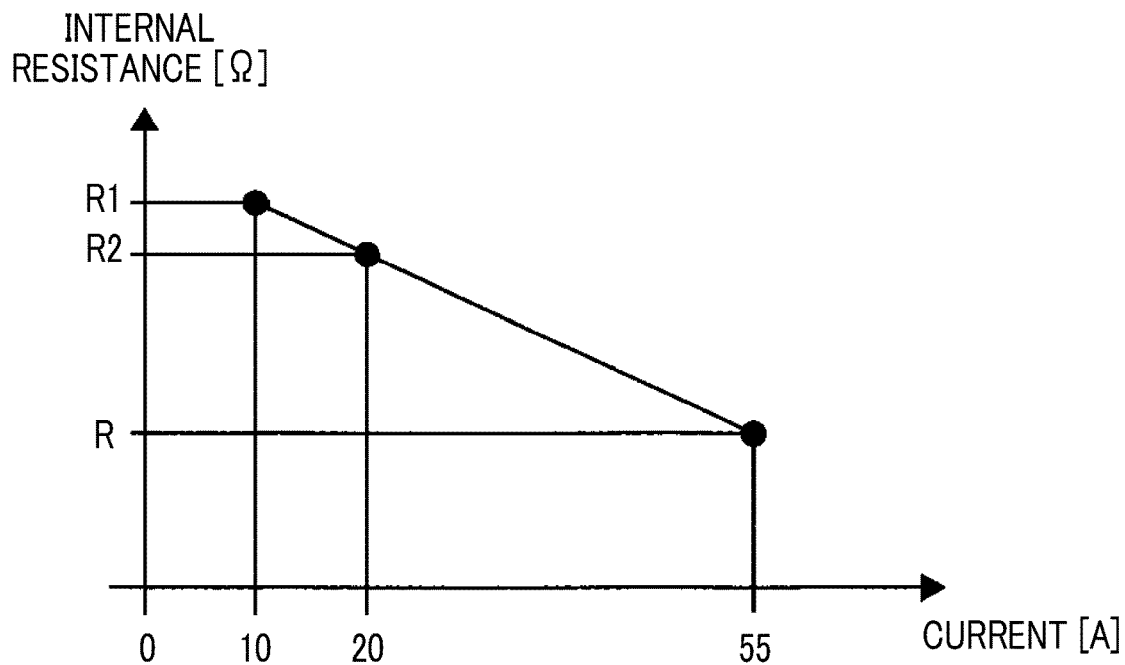
FIG. 7 is a graph showing an example of extrapolation processing of internal resistances according to the embodiment of the disclosure.

The diagnostic unit 13 linearly extrapolates the calculated internal resistances R1, R2 along the current and sets a value corresponding to the target current value (55 A) as an internal resistance R (third internal resistance value) at the target current (55 A) and the lapse of the target period (15 s). FIG. 7 shows a graph in which the horizontal axis represents a current, the vertical axis represents an internal resistance, and the internal resistances R1, R2, R are mapped.

Here, the general characteristics of the internal resistance of the battery will be described again. FIG. 8 is a graph in which the horizontal axis represents a discharge current, the vertical axis represents an internal resistance, and the actually measured internal resistance value when the battery 100 is discharged at −15° C., −10° C., and 20° C. and a current of 10 A, 20 A, 30 A, 40 A, and 55 A for a predetermined time is shown. As shown in FIG. 8, in general, when the temperature is constant, the internal resistance of the battery can obtain a good approximation by a linear approximation model with respect to a current.

Therefore, in the step, it is reasonable to estimate the internal resistance value when the discharge is performed at the target current value (55 A) during the target period (15 s) by linear extrapolation along the current. Note that, since the internal resistances R1, R2 are estimated slightly larger than the actual values in step S111, the internal resistance R is also estimated to be slightly larger than the actual value.

Step S113

The diagnostic unit 13 calculates a power value W at the voltage Vlow that is the lower limit voltage at which the load 400 can operate at the point in time when the battery 100 outputs the current of the target current value during the target period, using the third internal resistance value R and OCV according to the following (Expression 1).

$$W=(OCV-Vlow)/R \times Vlow \quad \text{(Expression 1)}$$

When the value of W is equal to or greater than the predetermined power value Wtarget, the diagnostic unit 13 determines that the battery 100 can hold the requested power as a diagnosis result, and otherwise, the diagnostic unit 13 determines that the battery 100 cannot hold the requested power. The diagnostic unit 13 may diagnose the battery 100 by another method based on the internal resistance R. Generally, determination can be made that the battery deteriorates as the internal resistance R increases. Since the internal resistance R is estimated slightly larger than the actual value as described above, the diagnosis result will evaluate the degree of deterioration to be larger than the actual level, but it is desirable from the viewpoint of severely evaluating the power supply system 1 and ensuring the safety of the vehicle more strongly.

The diagnostic unit 13 may notify other ECUs or the like mounted on the vehicle of the diagnosis result. Accordingly, the vehicle can execute predetermined processing such as notification to a user according to the diagnosis result.

In this way, the processing is ended. In the change pattern of the discharge current shown in FIG. 3, discharge at the second current value (20 A) which is larger than the first current value is executed continuously after the discharge at the first current value (10 A). However, it is possible to reduce the influence on the calculated internal resistance value in the order of discharging the large current value after the discharge at the small current value as described above.

In addition, when the discharge at the first current value and the discharge at the second current value are performed at a predetermined interval or more, either may be performed first. Each current value or the numerical value for specifying each period described above is an example, and the disclosure can be applied even when they are different numerical values.

EFFECT

As described above, according to the aspect of the disclosure, it is possible to appropriately estimate the internal resistance value of the battery when discharge is performed at the target current value during the target period based on a change in the measurement value of the internal resistance when discharge is performed at two current values smaller than the target current value during periods shorter than the target period and to make a diagnosis such as whether or not the battery can supply a predetermined power. Therefore, even when the diagnosis target is a sub-battery that is difficult to discharge, it is possible to make the diagnosis while suppressing the discharge current and the discharge period.

The disclosure is not limited to a diagnostic device for a battery and can also be applied to a diagnostic method for the battery that a computer provided in the diagnostic device executes the processing of each step described above, a diagnostic program for the battery in which the processing is described, or a power supply system and a vehicle.

The disclosure is useful for diagnosing the battery in a vehicle or the like.

What is claimed is:

1. A diagnostic device for a battery, the diagnostic device comprising:
    a measurement unit configured to acquire a voltage value of the battery; and
    a diagnostic unit configured to:
        cause the battery to perform discharge at a first current value during a first period and estimate a first internal resistance value that is the internal resistance value when the discharge at the first current value is continued during the first period, based on the voltage value acquired by the measurement unit,
        cause the battery to perform discharge at a first current value during a second period longer than the first period and estimate a second internal resistance value that is the internal resistance value when the discharge at the first current value is continued during the second period, based on the voltage value acquired by the measurement unit,
        cause the battery to perform discharge at a second current value larger than the first current value during the first period and estimate a third internal resistance value that is the internal resistance value when the discharge at the second current value is continued during the first period, based on the voltage value acquired by the measurement unit,
        cause the battery to perform discharge at the second current value during the second period and estimate a fourth internal resistance value that is the internal resistance value when the discharge at the second current value is continued during the second period, based on the voltage value acquired by the measurement unit, and diagnose the battery based on the first internal resistance value, the second internal resistance value, the third internal resistance value, and the fourth internal resistance value.

2. The diagnostic device according to claim 1, wherein the diagnostic unit is configured to cause the battery to perform the discharge at the first current value and then perform the discharge at the second current value.

3. The diagnostic device according to claim 1, wherein the diagnostic unit is further configured to cause the battery to perform discharge at a current value of zero.

4. The diagnostic device according to claim 3, wherein the diagnostic unit performs the discharge at a current value of zero before performing the discharge at the first current value.

5. The diagnostic device according to claim 3, wherein the diagnostic unit is configured to cause the battery to perform the discharge at the first current value and then perform the discharge at the second current value.

6. The diagnostic device according to claim 3, wherein the measurement unit is further configured to acquire a current value of the battery.

7. The diagnostic device according to claim 3, wherein the first current value is smaller than a predetermined target current value during the first period, the first period shorter than a predetermined target period.

8. The diagnostic device according to claim 1, wherein the diagnostic unit is configured to cause the battery to perform discharge at the first current value during the first period before causing the battery to perform discharge at the first current value during the second period.

9. The diagnostic device according to claim 1, wherein the measurement unit is further configured to acquire a current value of the battery.

10. The diagnostic device according to claim 1, wherein the first current value is smaller than a predetermined target current value during the first period, the first period shorter than a predetermined target period.

11. A diagnostic method for a battery executed by a computer of a diagnostic device for the battery, the diagnostic method comprising:

acquiring a voltage value of the battery;

causing the battery to perform discharge at a first current value during a first period and estimate a first internal resistance value that is the internal resistance value when the discharge at the first current value is continued during the first period, based on the acquired voltage value, causing the battery to perform discharge at a first current value during a second period longer than the first period and estimate a second internal resistance value that is the internal resistance value when the discharge at the first current value is continued during the second period, based on the acquired voltage value, causing the battery to perform discharge at a second current value larger than the first current value during the first period and estimate a third internal resistance value that is the internal resistance value when the discharge at the second current value is continued during the first period, based on the acquired voltage value, causing the battery to perform discharge at the second current value during the second period and estimate a fourth internal resistance value that is the internal resistance value when the discharge at the second current value is continued during the second period, based on the acquired voltage value, and diagnosing the battery based on the first internal resistance value, the second internal resistance value, the third internal resistance value, and the fourth internal resistance value.

12. The diagnostic method according to claim 11, further comprising causing the battery to perform the discharge at the first current value and then perform the discharge at the second current value.

13. The diagnostic method according to claim 11, further comprising causing the battery to perform discharge at a current value of zero.

14. The diagnostic method according to claim 13, further comprising performing the discharge at a current value of zero before performing the discharge at the first current value.

15. The diagnostic method according to claim 13, further comprising causing the battery to perform the discharge at the first current value and then perform the discharge at the second current value.

16. The diagnostic method according to claim 13, further comprising acquiring a current value of the battery.

17. The diagnostic method according to claim 13, wherein the first current value is smaller than a predetermined target current value during the first period, the first period shorter than a predetermined target period.

18. The diagnostic method according to claim 11, further comprising causing the battery to perform discharge at the first current value during the first period before causing the battery to perform discharge at the first current value during the second period.

19. The diagnostic method according to claim 11, further comprising acquiring a current value of the battery.

20. The diagnostic method according to claim 11, wherein the first current value is smaller than a predetermined target current value during the first period, the first period shorter than a predetermined target period.

* * * * *